(12) United States Patent
Chung

(10) Patent No.: US 10,347,587 B1
(45) Date of Patent: Jul. 9, 2019

(54) ELECTRONIC DEVICE AND ELECTROMAGNETIC SHIELDING DEVICE

(71) Applicant: Wistron Corp., New Taipei (TW)

(72) Inventor: Wen-Chao Chung, New Taipei (TW)

(73) Assignee: WISTRON CORP., New Taipei (TW)

(*) Notice: Subject to any disclaimer, the term of this patent is extended or adjusted under 35 U.S.C. 154(b) by 0 days.

(21) Appl. No.: 16/008,524

(22) Filed: Jun. 14, 2018

(30) Foreign Application Priority Data

Apr. 16, 2018 (TW) .............................. 107112898 A

(51) Int. Cl.
| H01L 23/552 | (2006.01) |
| H01L 23/538 | (2006.01) |
| H01L 25/18 | (2006.01) |
| H01L 23/367 | (2006.01) |

(52) U.S. Cl.
CPC ........ *H01L 23/552* (2013.01); *H01L 23/3675* (2013.01); *H01L 23/5386* (2013.01); *H01L 25/18* (2013.01)

(58) Field of Classification Search
CPC ............... H01L 23/552; H01L 23/3675; H01L 23/5386; H01L 25/18
USPC ......................................................... 257/659
See application file for complete search history.

(56) References Cited

U.S. PATENT DOCUMENTS

| 6,166,403 A | 12/2000 | Castagnetti et al. |
| 9,192,084 B2 * | 11/2015 | Ady, III ............... H05K 9/0022 |
| 2004/0113250 A1 | 6/2004 | Khandros et al. |
| 2015/0181772 A1 * | 6/2015 | Ady ..................... H05K 9/0022 361/752 |
| 2018/0235078 A1 * | 8/2018 | Simonato ............. H05K 1/0218 |

FOREIGN PATENT DOCUMENTS

| CN | 2491884 Y | 5/2002 |
| CN | 100463594 C | 2/2009 |
| CN | 102573345 A | 7/2012 |
| TW | 478726 U | 3/2002 |
| WO | 2017171893 A1 | 10/2017 |

OTHER PUBLICATIONS

Intellectual Property Office Ministry of Economic Affairs, R.O.C., Office Action, dated Aug. 20, 2018, Taiwan.

* cited by examiner

*Primary Examiner* — Tu-Tu V Ho
(74) *Attorney, Agent, or Firm* — Locke Lord LLP; Tim Tingkang Xia, Esq.

(57) ABSTRACT

The disclosure provides an electronic device including an electronic assembly, a heat dissipating component, an electromagnetic shielding structure and an electromagnetic shielding shed. The electronic assembly includes a circuit board, a processor, a memory and a bus. The processor, the memory and the bus are stacked on the circuit board. The bus is located between and electrically connected to the processor and the memory. The heat dissipating component is staked on the processor. The electromagnetic shielding structure covers the memory. A side of the electromagnetic shielding shed is connected to the electromagnetic shielding structure, another side of the electromagnetic shielding shed is connected to the heat dissipating component, and the electromagnetic shielding shed covers at least part of the bus.

20 Claims, 10 Drawing Sheets

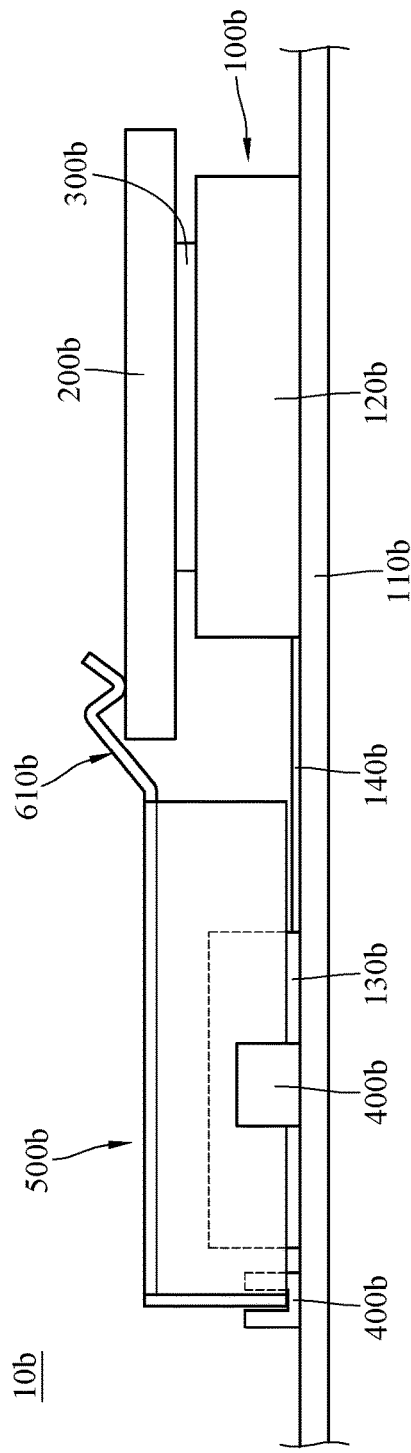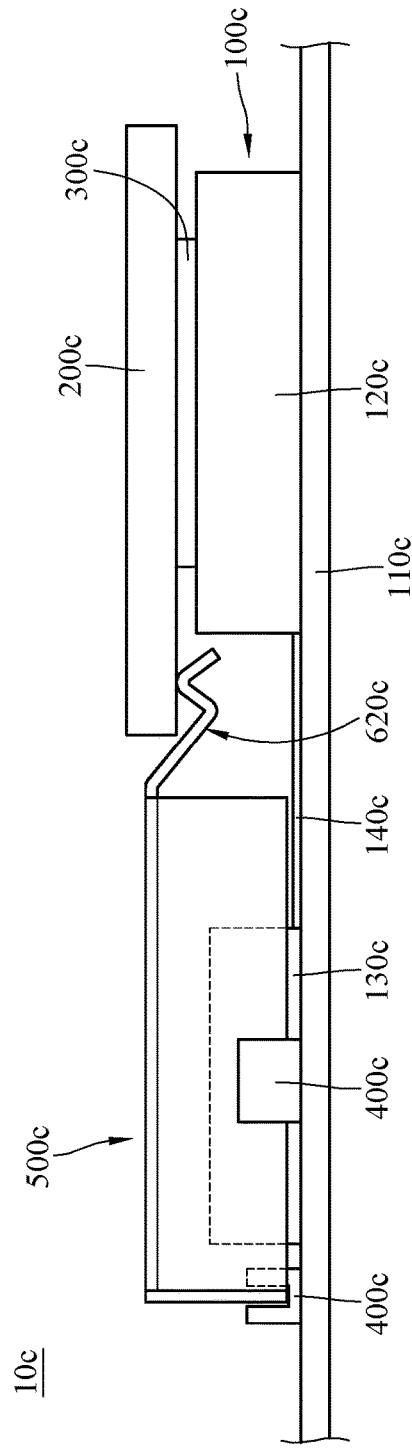

ELECTRONIC DEVICE AND ELECTROMAGNETIC SHIELDING DEVICE

CROSS-REFERENCE TO RELATED APPLICATIONS

This non-provisional application claims priority under 35 U.S.C. § 119(a) on Patent Application No(s). 107112898 filed in TAIWAN on Apr. 16, 2018, the entire contents of which are hereby incorporated by reference.

TECHNICAL FIELD

The disclosure relates to an electronic device and electromagnetic shielding device, more particularly to an electronic device and electromagnetic shielding device capable of suppressing electromagnetic interference.

BACKGROUND

In recent years, as audio/visual communication develops, the demands for file capacity or network traffic grow rapidly. Therefore, immediacy and transmission quality become important in developing electronic devices. These demands continually drive technologies of high speed transmission to progress. In order to speed up signal transmission and shorten the transmission time, some change the coding logic, reduce the signal level or change the transmission mode. To do so, standards for signal attenuation and electromagnetic interference (EMI) become more stringent than ever, such that developers put more efforts on improving the transmission quality and speed of a connector for transmitting signal between electronic components.

However, EMI is generated during signal transmission, and it is a disturbance that will cause any undesirable response, malfunctioning or degradation in the performance of electrical devices near the electronic device or even stop them from functioning. Therefore, how to suppress EMI so as to improve electromagnetic compatibility (EMC) also becomes more and more important.

SUMMARY

One embodiment of the disclosure provides an electronic device including an electronic assembly, a heat dissipating component, an electromagnetic shielding structure and an electromagnetic shielding shed. The electronic assembly includes a circuit board, a processor, a memory and a bus. The processor, the memory and the bus are stacked on the circuit board. The bus is located between and electrically connected to the processor and the memory. The heat dissipating component is staked on the processor. The electromagnetic shielding structure covers the memory. A side of the electromagnetic shielding shed is connected to the electromagnetic shielding structure, another side of the electromagnetic shielding shed is connected to the heat dissipating component, and the electromagnetic shielding shed covers at least part of the bus.

One embodiment of the disclosure provides an electromagnetic shielding device adapted to cover a memory and a bus. The electromagnetic shielding device includes an electromagnetic shielding structure and an electromagnetic shielding shed. The electromagnetic shielding structure is adapted to cover the memory. The electromagnetic shielding shed is connected to the electromagnetic shielding structure and adapted to cover at least part of the bus.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein:

FIG. 4 is a side view of an electronic device according to a second embodiment of the present disclosure;

FIG. 5 is a side view of an electronic device according to a third embodiment of the present disclosure;

DETAILED DESCRIPTION

Figure 1:
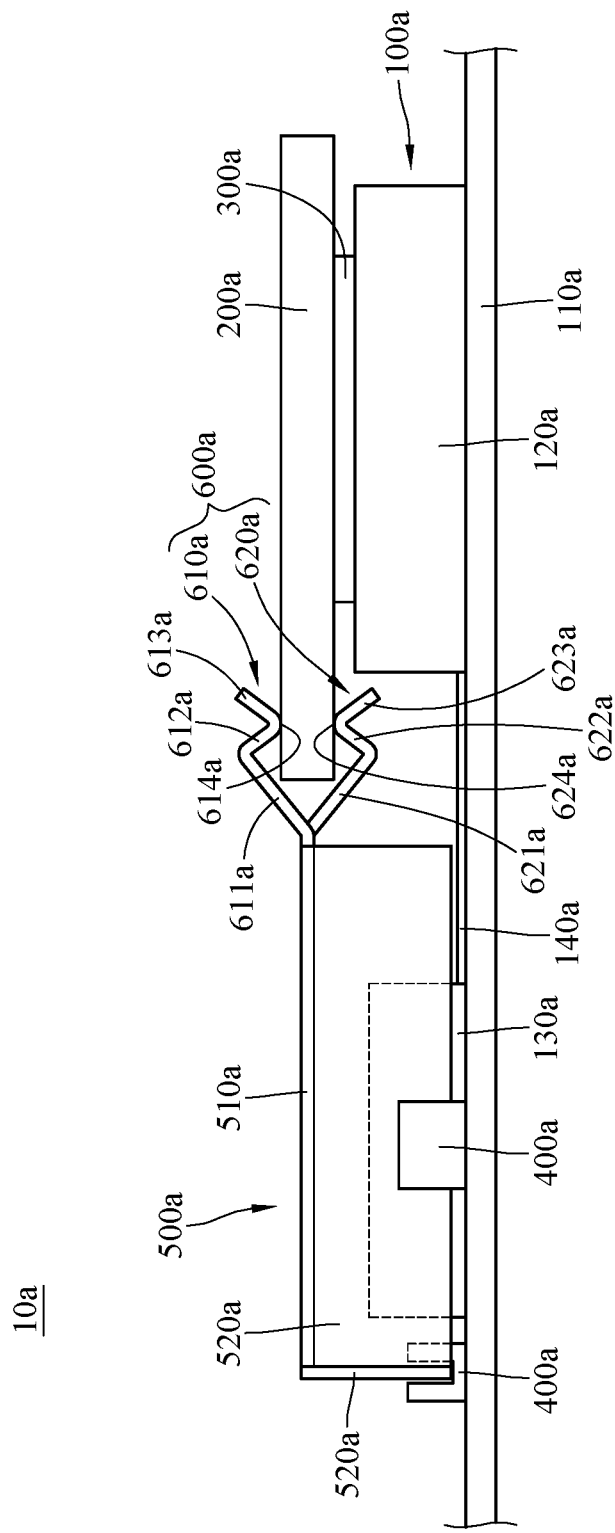
FIG. 1 is a side view of an electronic device according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

Figure 2:
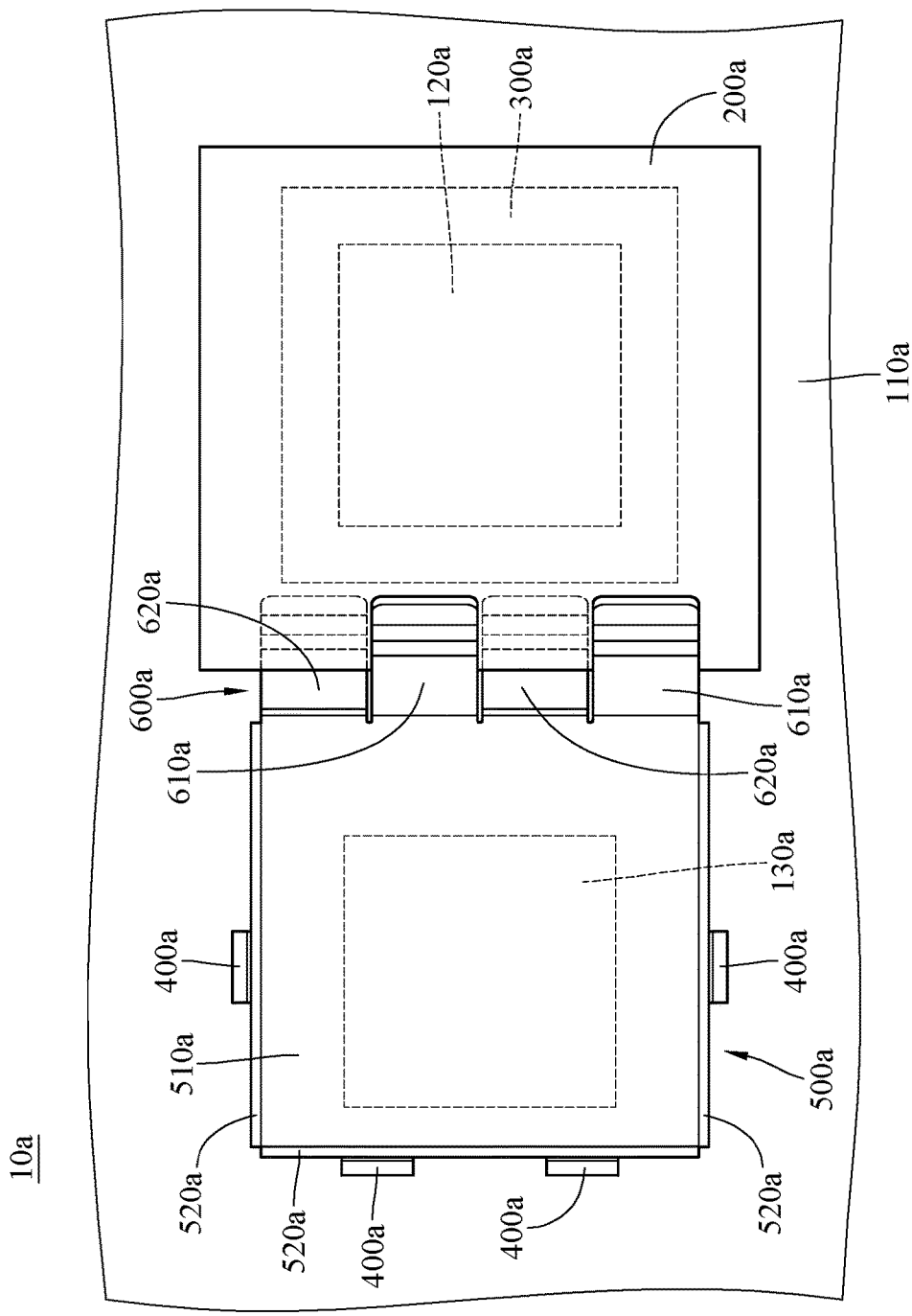
FIG. 2 is a top view of the electronic device in FIG. 1.
Figure 3:
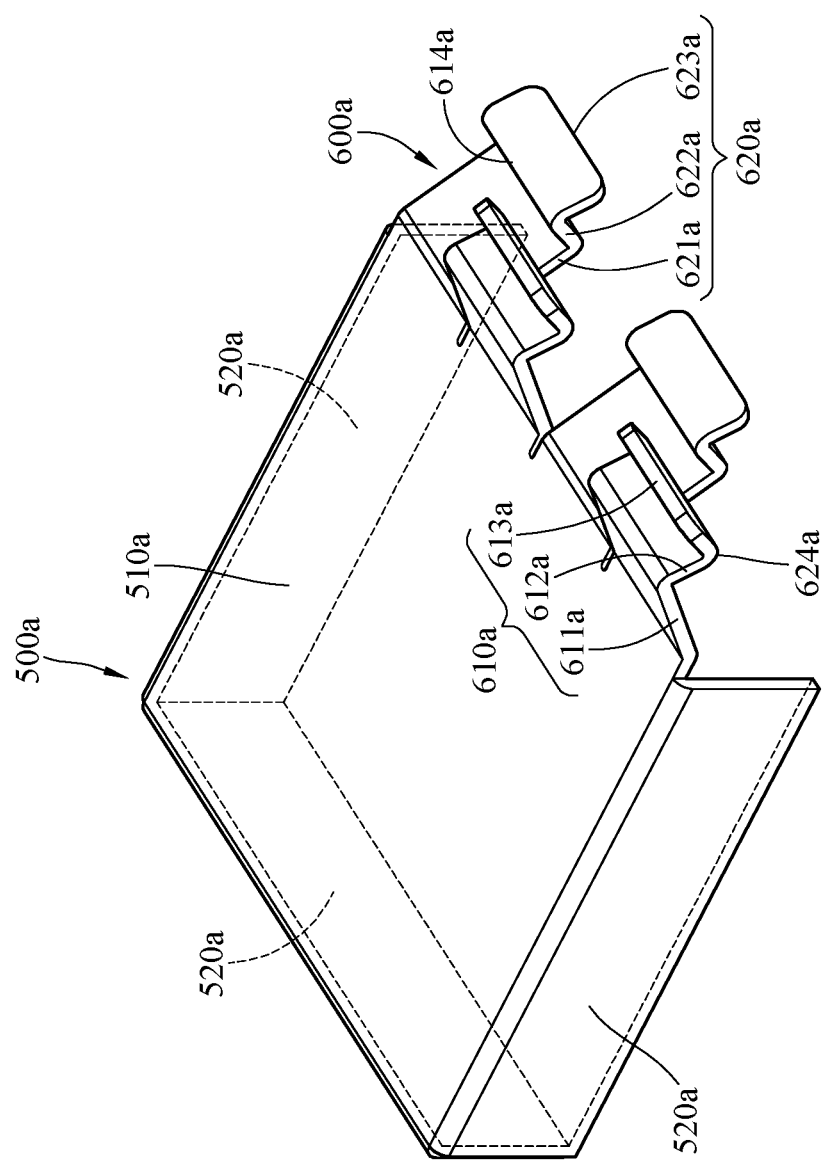
FIG. 3 is a perspective view of an electromagnetic shielding structure and electromagnetic shielding shed in FIG. 1.

Please refer to FIGS. 1 to 3. FIG. 1 is a side view of an electronic device according to a first embodiment of the present disclosure, FIG. 2 is a top view of the electronic device in FIG. 1, and FIG. 3 is a perspective view of an electromagnetic shielding structure and electromagnetic shielding shed in FIG. 1.

This embodiment provides an electronic device 10a. The electronic device 10a includes an electronic assembly 100a, a heat dissipating component 200a, a thermal conductive adhesive 300a, a plurality of electromagnetic shielding clips 400a, an electromagnetic shielding structure 500a, and an electromagnetic shielding shed 600a.

The electronic assembly 100a is, for example, a display card or a mainboard. The electronic assembly 100a in this embodiment is, for example, a mainboard. The electronic assembly 100a includes a circuit board 110a, a processor 120a, a memory 130a and a bus 140a. The processor 120a, the memory 130a and the bus 140a are stacked on the circuit board 110a. The processor 120a is, for example, a graphic processing unit (GPU). The memory 130a is, for example, a video random access memory (VRAM). The bus 140a is located between and electrically connected to the processor 120a and the memory 130a for signal transmission between the processor 120a and the memory 130a. The bus 140a is, for example, an I/O bus, PCIe bus, memory bus, front side bus, or system bus, but the present disclosure is not limited thereto.

The heat dissipating component 200a is, for example, a ceramic heat dissipating plate. The heat dissipating component 200a is stacked on the processor 120a via the thermal conductive adhesive 300a, and is able to cool the processor 120a.

The electromagnetic shielding clips 400a are fixed on the circuit board 110a by, for example, a surface adhesion technique. The electromagnetic shielding clips 400a surround the memory 130a and are electrically connected to at least one ground circuit of the circuit board 110a.

The electromagnetic shielding structure 500a is made of an electrical conducting material such as gold, silver, copper, or iron. The electromagnetic shielding structure 500a includes a cover plate 510a and a plurality of side plates 520a. The side plates 520a are respectively connected to different sides of the cover plate 510, and are respectively disposed on the electromagnetic shielding clips 400a. As such, the electromagnetic shielding structure 500a can cover the memory 130a, and can be connected to ground via the electromagnetic shielding clips 400a.

The electromagnetic shielding shed 600a is also made of an electrical conducting material such as gold, silver, copper, or iron. The electromagnetic shielding shed 600a is connected to a side of the electromagnetic shielding structure 500a. In this embodiment, the electromagnetic shielding shed 600a and the electromagnetic shielding structure 500a are made of a single piece. Another side of the electromagnetic shielding shed 600a is detachably connected to the heat dissipating component 200a.

The electromagnetic shielding shed 600a includes a plurality of first clamping pieces 610a and a plurality of second clamping pieces 620a which are arranged in a staggered manner. In this embodiment, each first clamping piece 610a is in a form of sheet, but the present disclosure is not limited to the shape of the first clamping pieces 610a. As shown in FIG. 2, it is understood that orthogonal projections of the first clamping pieces 610a and the second clamping pieces 620a on the circuit board 110a do not overlap one another. Thus, it is further understood that the first clamping pieces 610a, the second clamping pieces 620a and the cover plate 510a are made from the same plate, but the present disclosure is not limited thereto. In some embodiments, the first clamping pieces, the second clamping pieces and the cover plate may be made from different plates and be assembled together by riveting or welding.

In detail, each first clamping piece 610a is formed by a bending process, and includes a first elastic portion 611a, a second elastic portion 612a and a third elastic portion 613a. In each first clamping piece 610a, the second elastic portion 612a is located between and connected to the first elastic portion 611a and the third elastic portion 613a, and the first elastic portion 611a is located between and connected to the second elastic portion 612a and the cover plate 510a. In addition, in each first clamping piece 610a, the second elastic portion 612a is not parallel to the first elastic portion 611a, the third elastic portion 613a is not parallel to the second elastic portion 612a, such that there is a pressing edge 614a formed at the junction between the second elastic portion 612a and the third elastic portion 613a.

Similarly, each second clamping piece 620a is also formed by a bending process. Each second clamping piece 620a includes a first elastic portion 621a, a second elastic portion 622a and a third elastic portion 623a. In each second clamping piece 620a, the second elastic portion 622a is located between and connected to the first elastic portion 621a and the third elastic portion 623a, and the first elastic portion 621a is located between and connected to the second elastic portion 622a and the cover plate 510a. In addition, in each second clamping piece 620a, the second elastic portion 622a is not parallel to the first elastic portion 621a, the third elastic portion 623a is not parallel to the second elastic portion 622a, such that there is a pressing edge 624a formed at the junction between the second elastic portion 622a and the third elastic portion 623a.

As shown in FIG. 1, the heat dissipating component 200a can be clamped by the first clamping pieces 610a and the second clamping pieces 620a with the pressing edges 614a and 624a. Specifically, when the side plates 520a of the electromagnetic shielding structure 500a are respectively assembled on the electromagnetic shielding clips 400a, the pressing edges 614a of the first clamping pieces 610a press against a side of the heat dissipating component 200a away from the circuit board 110, and the pressing edges 624a of the second clamping pieces 620a press against a side of the heat dissipating component 200a facing the circuit board 110. By this configuration, the heat dissipating component 200a can be clamped between the first clamping pieces 610a and the second clamping pieces 620a, and the electromagnetic shielding shed 600a can cover at least part of the bus 140a. This configuration helps to suppress electromagnetic interference (EMI) caused from high-speed transmission lines of the bus 140a. The EMI occurs while electromagnetic signals transmitting between the processor 120a and the memory 130a through the bus 140a. The EMI is a disturbance (or electrical noise) that will cause any undesirable response, malfunctioning or degradation in the performance of components (e.g., RF circuits or differential transmission lines) of the electronic device 10a or electrical devices (e.g., a wireless key board or a wireless mouse) near the electronic device 10a or even stop them from functioning. Therefore, the electromagnetic shielding shed 600a covering at least part of the bus 104a is able to suppress EMI caused by high-speed signal transmission in the bus 140a and thus to reduce impact on peripheral electronic components, such that electromagnetic compatibility (EMC) is improved.

According to an comparison experiment of the electronic device of the previous embodiment and another electronic device without the electromagnetic shielding shed, a field strength of the vertical polarized wave of the EMI caused by the electronic device 10a is lower than the CISPR 22 Limit (40 dBμV/m, measured at 10 meters) from 1.74 dBμV/m to 5.74 dBμV/m, and a field strength of the horizontal polarized wave of the EMI caused by the electronic device 10a is lower than the CISPR 22 Limit (40 dBμV/m, measured at 10 meters) from 0.91 dBμV/m to 5.91 dBμV/m.

Furthermore, in contrast to the prior art that the bus is attached via an electrical conducting foam, the electromagnetic shielding shed 600a is connected to the heat dissipating component 200a by a clamping manner, which is convenient for assembly and disassembly.

In addition, the electromagnetic shielding structure 500a and the electromagnetic shielding shed 600a are also good heat conductors, thus they also can help to cool the processor 120a so as to reduce the cooling burden of the heat dissipating component 200a Furthermore, covering the bus 140a by the electromagnetic shielding shed 600a instead of enlarging the electromagnetic shielding structure 500a is to avoid using too many electromagnetic shielding clips 400a because too many electromagnetic shielding clips 400a may limit the arrangement of the bus 140a.

Moreover, in this embodiment, the heat dissipating component 200a is clamped by the electromagnetic shielding shed 600a, but the present disclosure is not limited thereto.

For example, please refer to FIG. 4, which is a side view of an electronic device according to a second embodiment of the present disclosure. It is noted that, in the second embodiment, a circuit board 110b, a processor 120b, a memory 130b and a bus 140b of an electronic assembly 100b, and a heat dissipating component 200b, a thermal conductive adhesive 300b, electromagnetic shielding clips 400b and an electromagnetic shielding structure 500b are similar to that of the first embodiment in FIG. 1 and therefore the detail descriptions thereof will not be repeated again.

In the second embodiment, there is only one first clamping piece 610b to press against a side of the heat dissipating component 200b away from the circuit board 110b and to cover part of the bus 140b. The first clamping piece 610b also can suppress the EMI.

For another example, please see FIG. 5, which is a side view of an electronic device according to a third embodiment of the present disclosure. It is noted that, in the third embodiment, a circuit board 110c, a processor 120c, a memory 130c and a bus 140c of an electronic assembly 100c, and a heat dissipating component 200c, a thermal conductive adhesive 300c, electromagnetic shielding clips 400c and an electromagnetic shielding structure 500c are similar to that of the first embodiment in FIG. 1 and therefore the detail descriptions thereof will not be repeated again.

In the third embodiment, there is only one second clamping piece 620c to press against a side of the heat dissipating component 200b facing the circuit board 110c and to cover part of the bus 140c. The second clamping piece 620c also can suppress the EMI.

Although, in the embodiments of FIG. 1-5, the electromagnetic shielding structure and the electromagnetic shielding shed are made of a single piece, the present disclosure is not limited thereto. In some embodiments, the electromagnetic shielding structure and the electromagnetic shielding shed may be two independent components that are detachably connected to each other, and the electromagnetic shielding shed and the heat dissipating component may be made of a single piece.

Figure 6:
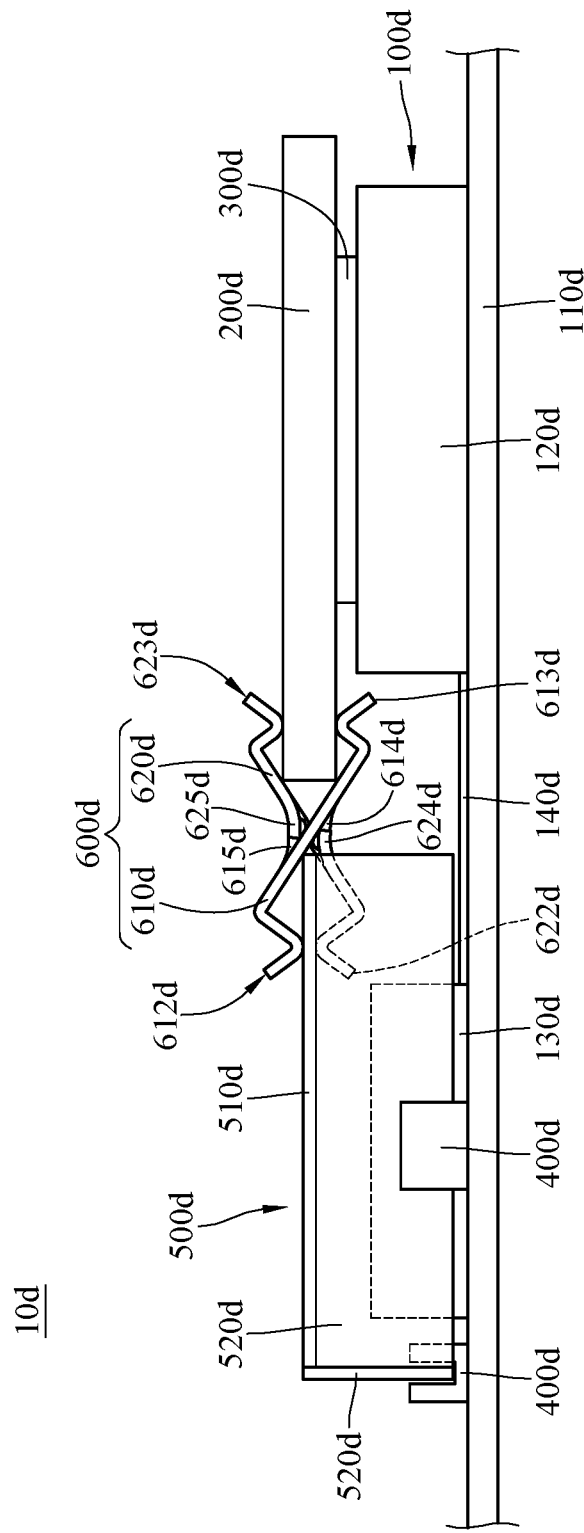
FIG. 6 is a side view of an electronic device according to a fourth embodiment of the present disclosure.
Figure 7:
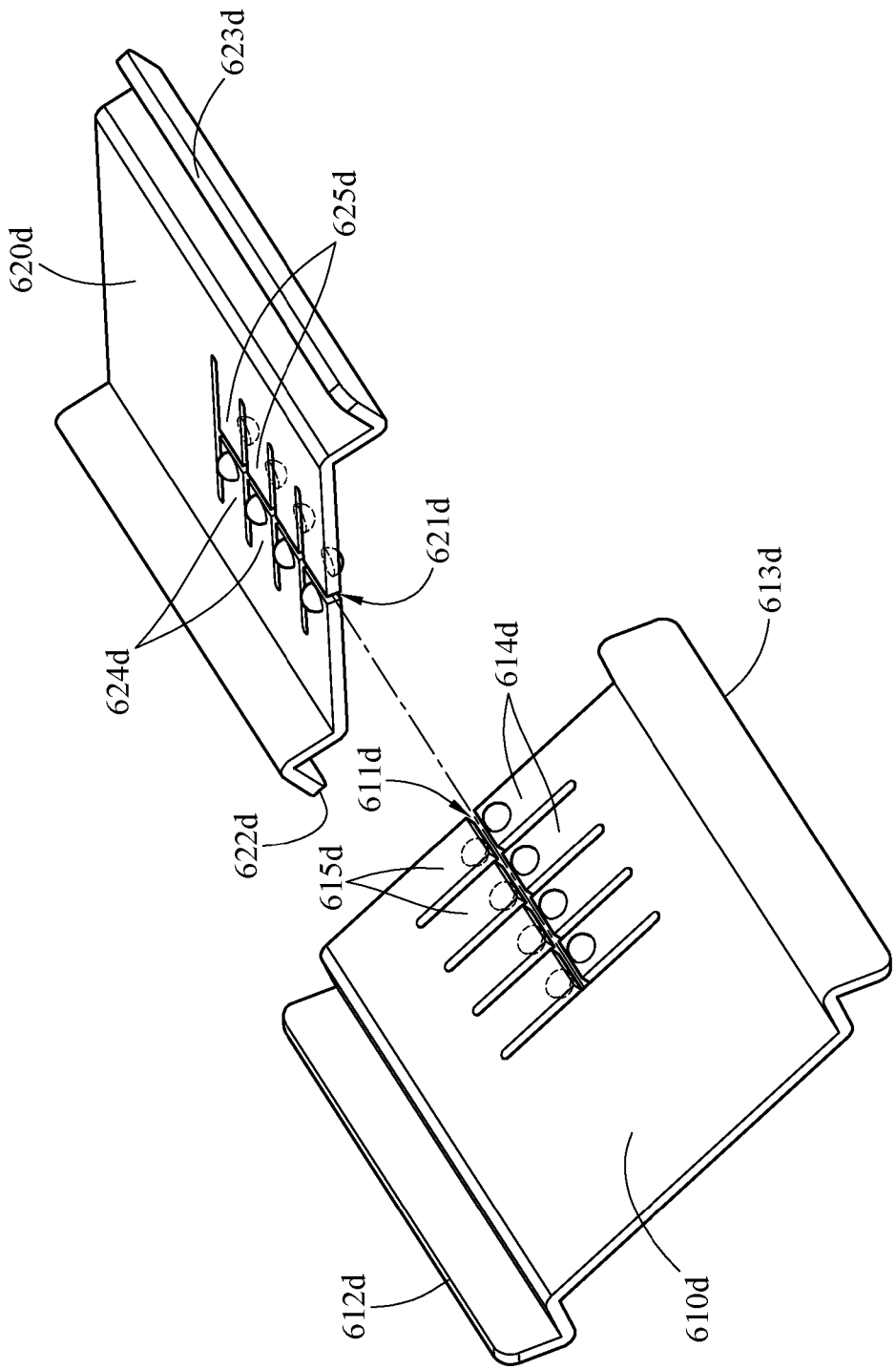
FIG. 7 is an exploded view of an electromagnetic shielding shed in FIG. 6.

For example, please refer to FIGS. 6 to 7. FIG. 6 is a side view of an electronic device according to a fourth embodiment of the present disclosure, and FIG. 7 is an exploded view of an electromagnetic shielding shed in FIG. 6. It is noted that, in the fourth embodiment, a circuit board 110d, a processor 120d, a memory 130d and a bus 140d of an electronic assembly 100d, and a heat dissipating component 200d, a thermal conductive adhesive 300d, electromagnetic shielding clips 400d and an electromagnetic shielding structure 500d are similar to that of the first embodiment in FIG. 1 and therefore the detail descriptions thereof will not be repeated again.

In the fourth embodiment, an electronic device 10d provides an electromagnetic shielding shed 600d, and the electromagnetic shielding shed 600d and the electromagnetic shielding structure 500d are two independent components. As shown in FIG. 6, two opposite sides of the electromagnetic shielding shed 600d are respectively detachably connected to the electromagnetic shielding structure 500d and the heat dissipating component 200d.

In detail, the electromagnetic shielding shed 600d includes a first clamping piece 610d and a second clamping piece 620d. The first clamping piece 610d has an insertion slot 611d, a first side 612d and a second side 613d. The first side 612d and the second side 613d are opposite sides of the first clamping piece 610d, and the insertion slot 611d is located between the first side 612d and the second side 613d.

The insertion slot 611d extends inward from an edge of the first clamping piece 610d. Similarly, the second clamping piece 620d has an insertion slot 621d, a first side 622d and a second side 623d. The first side 622d and the second side 623d are opposite sides of the second clamping piece 620d, and the insertion slot 621d is located between the first side 622d and the second side 623d. The insertion slot 621d extends inward from an edge of the second clamping piece 620d. The first clamping piece 610d and the second clamping piece 620 are intersected to each other via the insertion slot 611d and the insertion slot 621d.

In more detail, the first clamping piece 610d further has a plurality of first positioning elastic pieces 614d and a plurality of second positioning elastic pieces 615d at two opposite sides of the insertion slot 611d, and the second clamping piece 620d further has a plurality of first positioning elastic pieces 624d and a plurality of second positioning elastic pieces 625d at two opposite sides of the insertion slot 621d. When the first clamping piece 610d and the second clamping piece 620 are intersected to each other, the first positioning elastic pieces 614d and the second positioning elastic pieces 615d of the first clamping piece 610d respectively press against two opposite sides of the second clamping piece 620d, and the first positioning elastic pieces 624d and the second positioning elastic pieces 625d of the second clamping piece 620d respectively press against two opposite sides of the first clamping piece 610d. This configuration helps to maintain the intersecting state of the first clamping piece 610d and the second clamping piece 620d.

As shown in FIG. 6, the first side 612d of the first clamping piece 610d and the first side 622d of the second clamping piece 620d can clamp the electromagnetic shielding structure 500d, and the second side 613d of the first clamping piece 610d and the second side 623d of the second clamping piece 620d can clamp the heat dissipating component 200d. Therefore, the first clamping piece 610d and the second clamping piece 620d can together cover part of the bus 140d so as to suppress the EMI.

Figure 8:
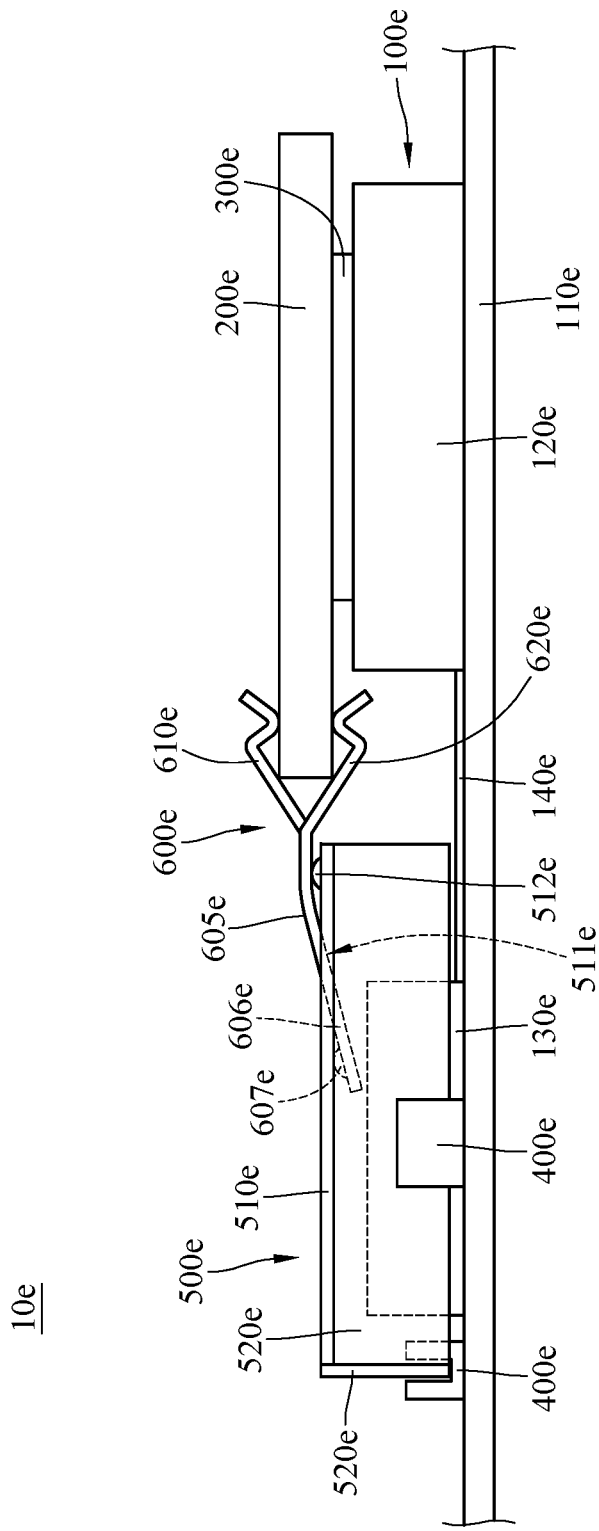
FIG. 8 is a side view of an electronic device according to a fifth embodiment of the present disclosure.
Figure 9:
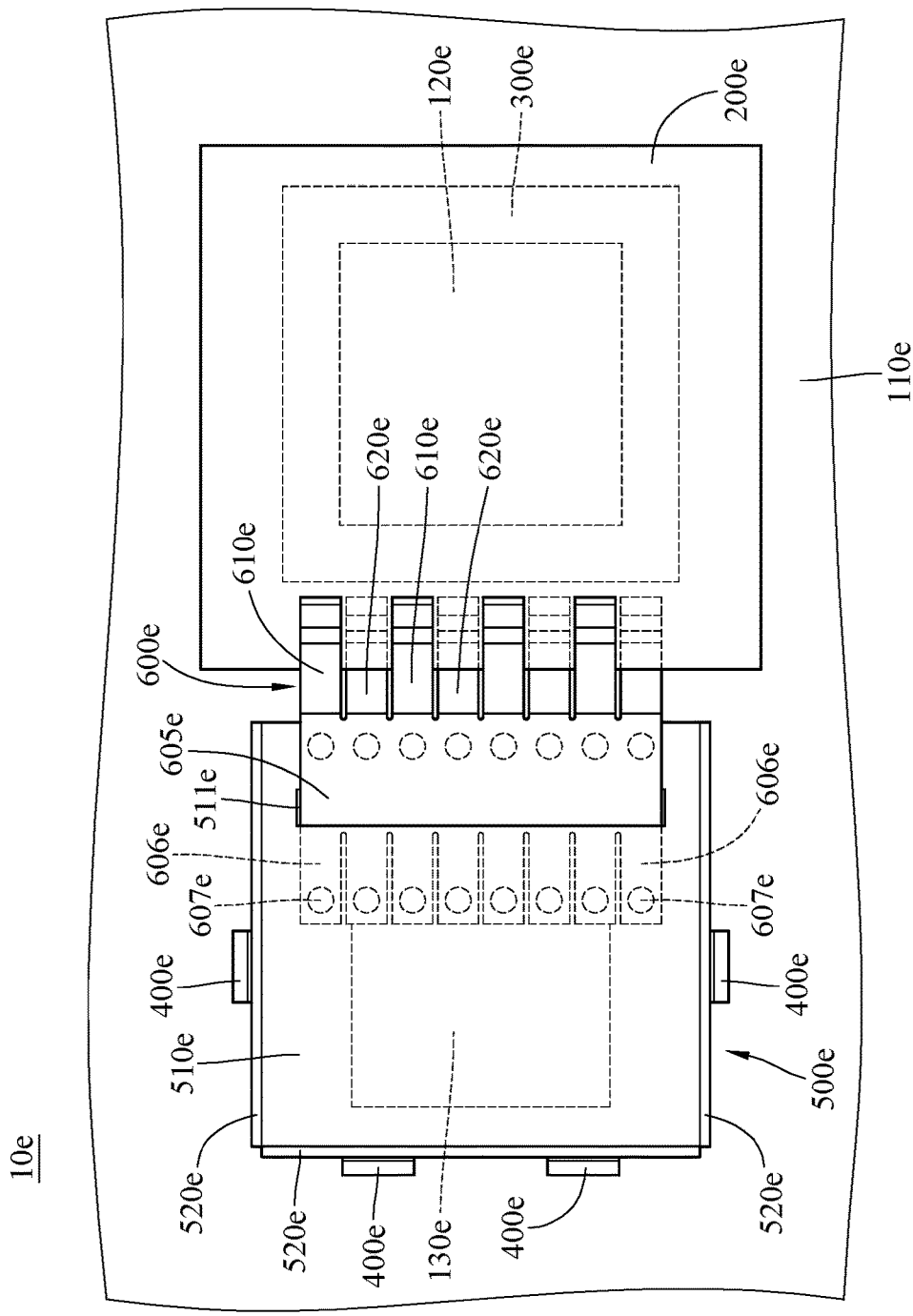
FIG. 9 is a top view of the electronic device in FIG. 8.
Figure 10:
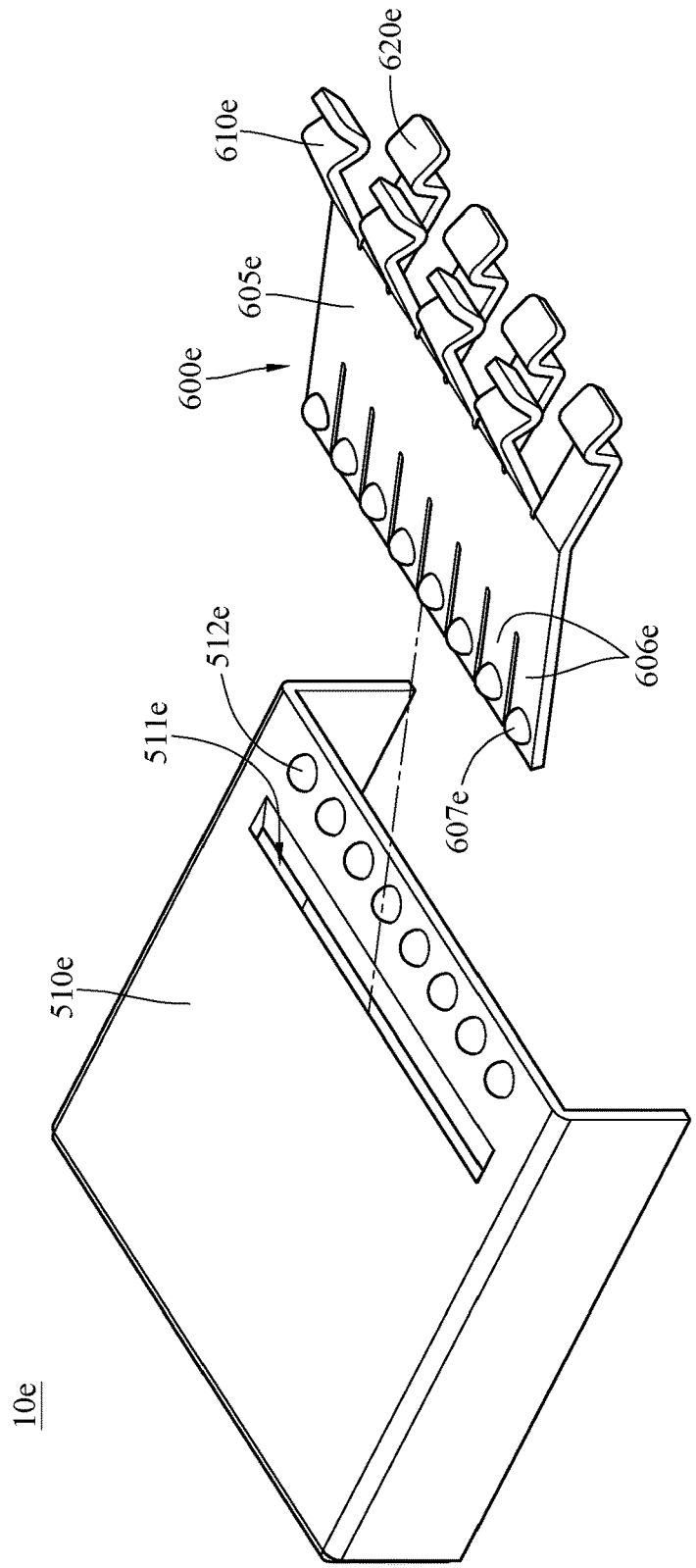
FIG. 10 is an exploded view of an electromagnetic shielding structure and electromagnetic shielding shed in FIG. 8.

Then, please refer to FIGS. 8 to 10. FIG. 8 is a side view of an electronic device according to a fifth embodiment of the present disclosure, FIG. 9 is a top view of the electronic device in FIG. 8, and FIG. 10 is an exploded view of an electromagnetic shielding structure and electromagnetic shielding shed in FIG. 8.

This embodiment provides an electronic device 10e including an electromagnetic shielding shed 600e, and two opposite sides of the electromagnetic shielding shed 600e are respectively detachably connected to an electromagnetic shielding structure 500e and a heat dissipating component 200e.

In detail, a cover plate 510e includes an insertion slot 511e and a plurality of first pressing contacts 512e. The first pressing contacts 512e are closer to a processor 120e than the insertion slot 511e and are located on a side of the cover plate 510e away from the circuit board 110e. The electromagnetic shielding shed 600e includes an insertion portion 605e, a plurality of first clamping pieces 610e, a plurality of second clamping pieces 620e, a plurality of elastic pieces 606e and a plurality of second pressing contacts 607e. The first clamping pieces 610e and the second clamping pieces 620e are located at the same side of the insertion portion 605e. The elastic pieces 606e are located at a side of the insertion portion 605e opposite to the first clamping pieces 610e and the second clamping pieces 620e. The second pressing contacts 607e are respectively located on and protrude from the elastic pieces 606e.

The insertion portion 605e is detachably inserted into the insertion slot 611e, the first pressing contacts 512e press against the insertion portion 605e, and the second pressing contacts 607e on the elastic pieces 606e press against a side of the cover plate 510e facing the circuit board 110e, such that the electromagnetic shielding shed 600e can be fixed on the electromagnetic shielding structure 500e. The first clamping pieces 610e and the second clamping pieces 620e can clamp the heat dissipating component 200e, such that the electromagnetic shielding shed 600e can be fixed on the heat dissipating component 200e. As such, the electromagnetic shielding shed 600e also can cover part of the bus 140e so as to suppress the EMI.

Figure 11:
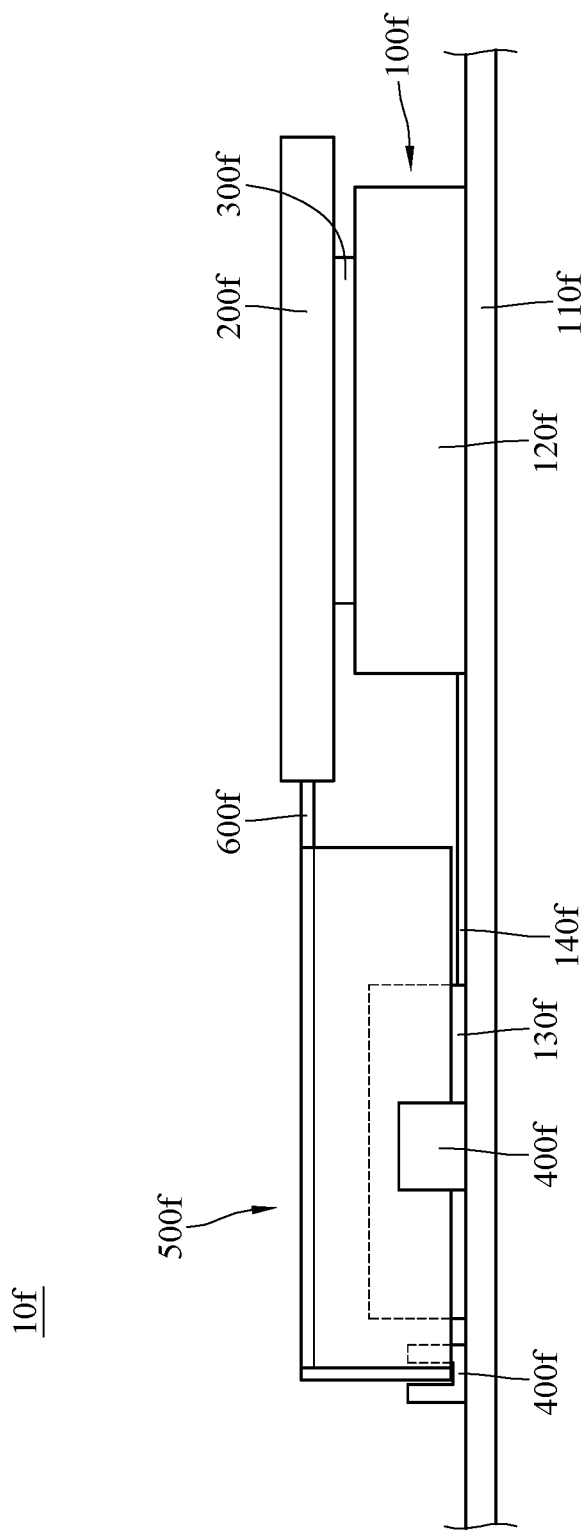
FIG. 11 is a side view of an electronic device according to a sixth embodiment of the present disclosure.

Then, please refer to FIG. 11, which is a side view of an electronic device according to a sixth embodiment of the present disclosure.

This embodiment provides an electronic device 10f, and the electronic device 10f includes an electronic assembly 100f, a heat dissipating component 200f, a thermal conductive adhesive 300f, a plurality of electromagnetic shielding clips 400f, an electromagnetic shielding structure 500f, and an electromagnetic shielding shed 600f It is noted that a circuit board 110f, a processor 120f, a memory 130f and a bus 140f of the electronic assembly 100f are similar to that of the electronic assembly 100a in the first embodiment and therefore the detail descriptions thereof will not be repeated again.

The heat dissipating component 200f is disposed on the processor 120f via the thermal conductive adhesive 300f The electromagnetic shielding clips 400f are fixed on the circuit board 110f, and the electromagnetic shielding structure 500f is disposed on the electromagnetic shielding clips 400f and covers the memory 130f The electromagnetic shielding shed 600f is located at a side of the electromagnetic shielding structure 500f, and the electromagnetic shielding shed 600f and electromagnetic shielding structure 500f are made of a single piece. Another side of the electromagnetic shielding shed 600f is in contact with the heat dissipating component 200f, and the electromagnetic shielding shed 600f covers part of the bus 140f As such, the electromagnetic shielding structure 500f and the electromagnetic shielding shed 600f together form an electromagnetic shielding device which is capable of suppressing EMI.

In this embodiment, the electromagnetic shielding shed 600f is located between and connected to the electromagnetic shielding structure 500f and the heat dissipating component 200f, but the present disclosure is not limited thereto. In some other embodiments, the electromagnetic shielding shed may be located between and connected to the electromagnetic shielding structure and another electronic component such as a processor.

According to the electronic device and electromagnetic shielding device as discussed in above, except for the electromagnetic shielding structure to cover the memory, there is an electromagnetic shielding shed connected to the electromagnetic shielding structure and the heat dissipating component to further cover at least part of the bus. Therefore, the electromagnetic interference (EMI) caused by high-speed signal transmission in the bus can be suppressed, thereby preventing EMI from affecting delicate electronics near the electronic device and improving electromagnetic compatibility (EMC).

In addition, since the electromagnetic shielding shed is located between and connected to the electromagnetic shielding structure and the heat dissipating component, the electromagnetic shielding shed can also help to cool the electronic assembly so as to reduce the cooling burden of the heat dissipating component.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electronic device, comprising:
    an electronic assembly, comprising a circuit board, a processor, a memory and a bus, the processor, the memory and the bus stacked on the circuit board, and the bus located between and electrically connected to the processor and the memory;
    a heat dissipating component, staked on the processor;
    an electromagnetic shielding structure, covering the memory; and
    an electromagnetic shielding shed, a side of the electromagnetic shielding shed connected to the electromagnetic shielding structure, another side of the electromagnetic shielding shed connected to the heat dissipating component, and the electromagnetic shielding shed covering at least part of the bus.

2. The electronic device according to claim 1, wherein the electromagnetic shielding shed and the electromagnetic shielding structure are made of a single piece, and the electromagnetic shielding shed is detachably connected to the heat dissipating component.

3. The electronic device according to claim 2, wherein the electromagnetic shielding shed comprises two clamping pieces, and the heat dissipating component is clamped by the two clamping pieces.

4. The electronic device according to claim 3, wherein orthogonal projections of the two clamping pieces on the circuit board do not overlap to each other.

5. The electronic device according to claim 3, wherein each of the clamping pieces comprises a first elastic portion, a second elastic portion and a third elastic portion, the second elastic portion is located between and connected to the first elastic portion and the third elastic portion, the first elastic portion is connected to the electromagnetic shielding structure, the second elastic portion is not parallel to the first elastic portion, the third elastic portion is not parallel to the second elastic portion, and a pressing edge is formed at a junction between the second elastic portion and the third elastic portion.

6. The electronic device according to claim 1, wherein the electromagnetic shielding shed is detachably connected to the electromagnetic shielding structure and the heat dissipating component.

7. The electronic device according to claim 6, wherein the electromagnetic shielding shed comprises two clamping pieces, each of the clamping pieces has an insertion slot, a first side and a second side, the first side and the second side are opposite to each other, the insertion slot is located between the first side and the second side and extends inward from an edge of the clamping piece, the two clamping pieces are intersected to each other via the insertion slots, the electromagnetic shielding structure is clamped by the first sides of the clamping pieces, and the heat dissipating component is clamped by the second sides of the clamping pieces.

8. The electronic device according to claim 7, wherein each of the clamping pieces further has a plurality of first positioning elastic pieces and a plurality of second positioning elastic pieces that are located at two opposite sides of the insertion slot, wherein the plurality of first positioning elastic pieces and the plurality of second positioning elastic pieces of one of the clamping pieces respectively press against two opposite sides of the other clamping piece.

9. The electronic device according to claim 1, wherein the electromagnetic shielding structure comprises a cover plate and a plurality of side plates, the plurality of side plates are respectively connected to different sides of the cover plate, the cover plate and the plurality of side plates together cover the memory, the cover plate has an insertion slot, the electromagnetic shielding shed comprises an insertion portion and two clamping pieces, the insertion portion is inserted into the insertion slot, the two clamping pieces are connected to a side of the insertion portion, and the heat dissipating component is clamped by the two clamping pieces.

10. The electronic device according to claim 9, wherein the cover plate has at least one first pressing contact on a side of the cover plate away from the circuit board, the insertion portion has at least one elastic piece and a second pressing contact, the at least one elastic piece is at a side of the insertion portion away from the two clamping pieces, the second pressing contact is on the at least one elastic piece, the at least one first pressing contact presses against the insertion portion, and the second pressing contact presses against a side of the cover plate facing the circuit board so as to position the electromagnetic shielding shed.

11. The electronic device according to claim 1, wherein the electromagnetic shielding shed and the heat dissipating component are made of a single piece, the electromagnetic shielding shed is detachably connected to the electromagnetic shielding structure.

12. The electronic device according to claim 1, wherein the electromagnetic shielding shed is electrically connected to a ground circuit of the circuit board.

13. An electromagnetic shielding device, adapted to cover a memory and a bus, the electromagnetic shielding device comprising:
an electromagnetic shielding structure, adapted to cover the memory; and
an electromagnetic shielding shed, directly connected to the electromagnetic shielding structure and adapted to cover at least part of the bus.

14. The electromagnetic shielding device according to claim 13, wherein the electromagnetic shielding shed comprises two clamping pieces, the two clamping pieces and the electromagnetic shielding structure are made of a single piece, and the two clamping pieces are adapted to clamp a heat dissipating component.

15. The electromagnetic shielding device according to claim 14, wherein orthogonal projections of the two clamping pieces on the circuit board do not overlap to each other.

16. The electromagnetic shielding device according to claim 14, wherein each of the clamping pieces comprises a first elastic portion, a second elastic portion and a third elastic portion, the second elastic portion is located between and connected to the first elastic portion and the third elastic portion, the first elastic portion is connected to the electromagnetic shielding structure, the second elastic portion is not parallel to the first elastic portion, the third elastic portion is not parallel to the second elastic portion, and a pressing edge is formed at a junction between the second elastic portion and the third elastic portion.

17. The electromagnetic shielding device according to claim 13, wherein the electromagnetic shielding shed comprises two clamping pieces, each of the clamping pieces has an insertion slot, a first side and a second side, the first side and the second side are opposite to each other, the insertion slot is located between the first side and the second side and extends inward from an edge of the clamping piece, the two clamping pieces are intersected to each other via the insertion slots, the electromagnetic shielding structure is clamped by the first sides of the clamping pieces, and the second sides of the clamping pieces are adapted to clamp a heat dissipating component.

18. The electromagnetic shielding device according to claim 17, wherein each of the clamping pieces further has a plurality of first positioning elastic pieces and a plurality of second positioning elastic pieces that are located at two opposite sides of the insertion slot, wherein the plurality of first positioning elastic pieces and the plurality of second positioning elastic pieces of one of the clamping pieces respectively press against two opposite sides of the other clamping piece.

19. The electromagnetic shielding device according to claim 13, wherein the electromagnetic shielding structure comprises a cover plate and a plurality of side plates, the plurality of side plates are respectively connected to different sides of the cover plate, the cover plate and the plurality of side plates together cover the memory, the cover plate has an insertion slot, the electromagnetic shielding shed comprises an insertion portion and two clamping pieces, the insertion portion is inserted into the insertion slot, the two clamping pieces are connected to a side of the insertion portion and adapted to clamp a heat dissipating component.

20. The electromagnetic shielding device according to claim 19, wherein the cover plate has at least one first pressing contact on a side of the cover plate away from the circuit board, the insertion portion has at least one elastic piece and a second pressing contact, the at least one elastic piece is at a side of the insertion portion away from the two clamping pieces, the second pressing contact is on the at least one elastic piece, the at least one first pressing contact presses against the insertion portion, and the second pressing contact presses against a side of the cover plate facing the circuit board so as to position the electromagnetic shielding shed.

* * * * *